(12) United States Patent
Roca Vila et al.

(10) Patent No.: US 11,348,313 B2
(45) Date of Patent: May 31, 2022

(54) ARRANGING THREE-DIMENSIONAL MODELS

(71) Applicant: Hewlett-Packard Development Company, L.P., Spring, TX (US)

(72) Inventors: Jordi Roca Vila, Sant Cugat del Valles (ES); Sergio Gonzalez Martin, Sant Cugat del Valles (ES); Quim Muntal Diaz, Sant Cugat del Valles (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/251,989

(22) PCT Filed: Mar. 27, 2019

(86) PCT No.: PCT/US2019/024349
§ 371 (c)(1),
(2) Date: Dec. 14, 2020

(87) PCT Pub. No.: WO2020/197553
PCT Pub. Date: Oct. 1, 2020

(65) Prior Publication Data
US 2022/0012944 A1   Jan. 13, 2022

(51) Int. Cl.
*G06T 17/20* (2006.01)
*B29C 64/386* (2017.01)
(Continued)

(52) U.S. Cl.
CPC .......... *G06T 17/20* (2013.01); *B29C 64/386* (2017.08); *G06F 30/23* (2020.01); *G06T 19/20* (2013.01);
(Continued)

(58) Field of Classification Search
None
See application file for complete search history.

(56) References Cited

U.S. PATENT DOCUMENTS 5,596,504 A * 1/1997 Tata ...................... B29C 64/393
700/120
8,032,337 B2   10/2011 Deichmann et al.
(Continued)

FOREIGN PATENT DOCUMENTS

WO   WO2018127429 A1   7/2018

OTHER PUBLICATIONS

Xuelin Chen, Hao Zhang, Jinjie Lin, Ruizhen Hu, Lin Lu, Qixing Huang, Bedrich Benes, Daniel Cohen-Or, Baoquan Chen, "Dapper: Decompose-and-Pack for 3D Printing", Nov. 2015, ACM, ACM Transactions on Graphics, vol. 34, Issue 6, Article 213, pp. 1-12.*
(Continued)

*Primary Examiner* — Robert Bader
(74) *Attorney, Agent, or Firm* — HP Inc. Patent Development

(57) ABSTRACT

Examples of the present disclosure relate to a method for packing three dimensional (3D) models. The method comprises identifying a plurality of sections of each 3D model according to curvature profiles of the sections; associating a build material layer thickness to each section of the plurality of sections, whereby each associated build material layer thickness is one of a set of pre-established build material layer thicknesses; packing the plurality of 3D models according to each associated build material layer thickness, whereby packing comprises spatially arranging at least some 3D models in the 3D virtual build volume according to one or more criteria, such that at least some of the sections of different 3D models associated to a same build material layer thickness are arranged in a same region of the 3D virtual build volume.

15 Claims, 6 Drawing Sheets

(51) Int. Cl.
*G06F 30/23* (2020.01)
*B33Y 50/02* (2015.01)
*G06T 19/20* (2011.01)

(52) U.S. Cl.
CPC ....... *B33Y 50/02* (2014.12); *G06T 2219/2004* (2013.01)

(56) References Cited

U.S. PATENT DOCUMENTS

| | | |
|---|---|---|
| 8,167,999 B2 | 5/2012 | Alam et al. |
| 9,916,684 B2 | 3/2018 | Goel et al. |
| 10,061,870 B2 | 8/2018 | Nelaturi et al. |
| 2014/0074274 A1 | 3/2014 | Douglas et al. |
| 2015/0331402 A1 | 11/2015 | Lin et al. |
| 2016/0046076 A1 | 2/2016 | Huang et al. |
| 2016/0370791 A1* | 12/2016 | Revanur ............ G05B 19/4099 |
| 2017/0252978 A1* | 9/2017 | Claes ................... B23K 26/342 |
| 2018/0329658 A1* | 11/2018 | Collomp ............... B29C 64/386 |
| 2019/0143588 A1* | 5/2019 | Hakkaku ............... B29C 64/182 |
| | | 425/162 |

OTHER PUBLICATIONS

J. Vanek, J. A. Garcia Galicia, B. Benes, R. Měch, N. Carr, O. Stava, G. S. Miller, "PackMerger: A 3D Print Volume Optimizer", Sep. 2014, Wiley, vol. 33, Issue 6, pp. 322-332.*

* cited by examiner

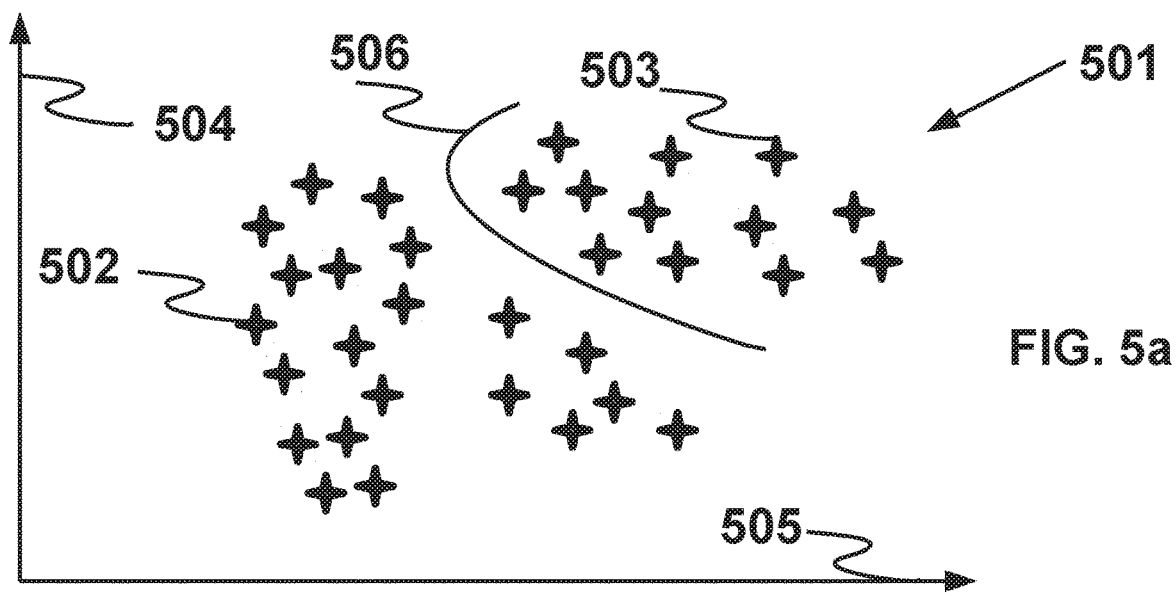
FIG. 5a
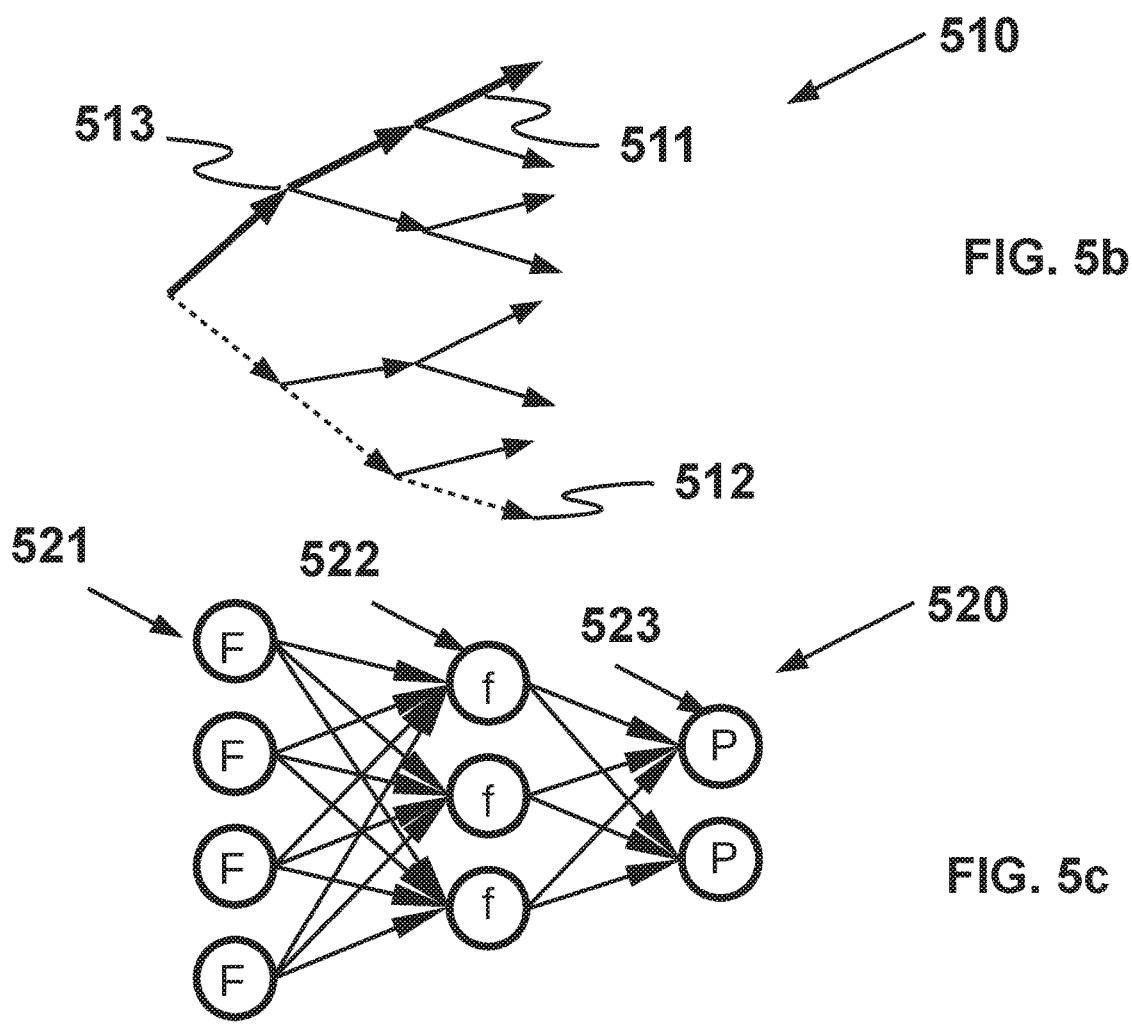
FIG. 5b
FIG. 5c

ARRANGING THREE-DIMENSIONAL MODELS

BACKGROUND

Some 3D printing systems may form successive layers of build material on a build platform and may selectively solidify regions of each layer to form three-dimensional (3D) objects in a layer-wise manner. Some 3D models may consume intensive computing resources to prepare their printing into objects.

BRIEF DESCRIPTION OF THE DRAWINGS

FIG. 5 is a representation of an example of a method according to the present disclosure.

DETAILED DESCRIPTION

This disclosure relates to processing three-dimensional, or 3D, models. Three-dimensional 3D models may be digital representations or digital files comprising digital information or data which may be translated into a tangible 3D object, for example by printing. Such 3D models may hold information, for example information related to objects having a simple or a relatively complex shape. Some 3D printing techniques may cause objects to be generated that exhibit a visual effect named stair-stepping. The stair-stepping effect becomes visible using a 3D printing layer-by-layer technique and is caused by an offset between an object printed layers when curves of the object varies between layers. Due to the fact that the layers of an object may present discrete thicknesses, a non-horizontal or a non-vertical surface may exhibit a certain degree of stair-stepping effect. This is due to the discontinuity produced between one layer and the following layer. Solutions according to this disclosure have been developed to alleviate the stair-stepping effect in the case of simple or relatively complex or curved surfaces. In printing systems in which an object is generated using a layer-by-layer technique, stair-stepping may be alleviated by using a layer thickness which reduces the stair-stepping effect, for example by using a relatively thin layer for a curved object or an object presenting a curved section. The stair-stepping effect may be reduced for a plurality of objects by controlling the manner in which the plurality of objects are packed or nested in a build volume or printable box. A plurality of 3D objects may be packed according to a packing scheme which may be described by digital information specifying 3D models packed in a 3D virtual build volume. Packing 3D models in a 3D virtual build volume should be understood as placing or arranging 3D models in a position and/or orientation in which the dimensions of the 3D virtual build volume are exploited according to some criteria. In other words, packing may result in filling the 3D virtual build volume with a plurality of 3D models, in such a way that, for example, the stair-stepping effect is alleviated or a minimum packing distance is respected, whereby a packing distance may reduce or prevent thermal interaction between adjacent printed objects. This disclosure proposes to arrange 3D models in a 3D virtual build volume to both control stair stepping and efficiently use the 3D virtual build volume through the association between build material thicknesses and sections of the 3D models as will be described in more details below.

Figure 1:
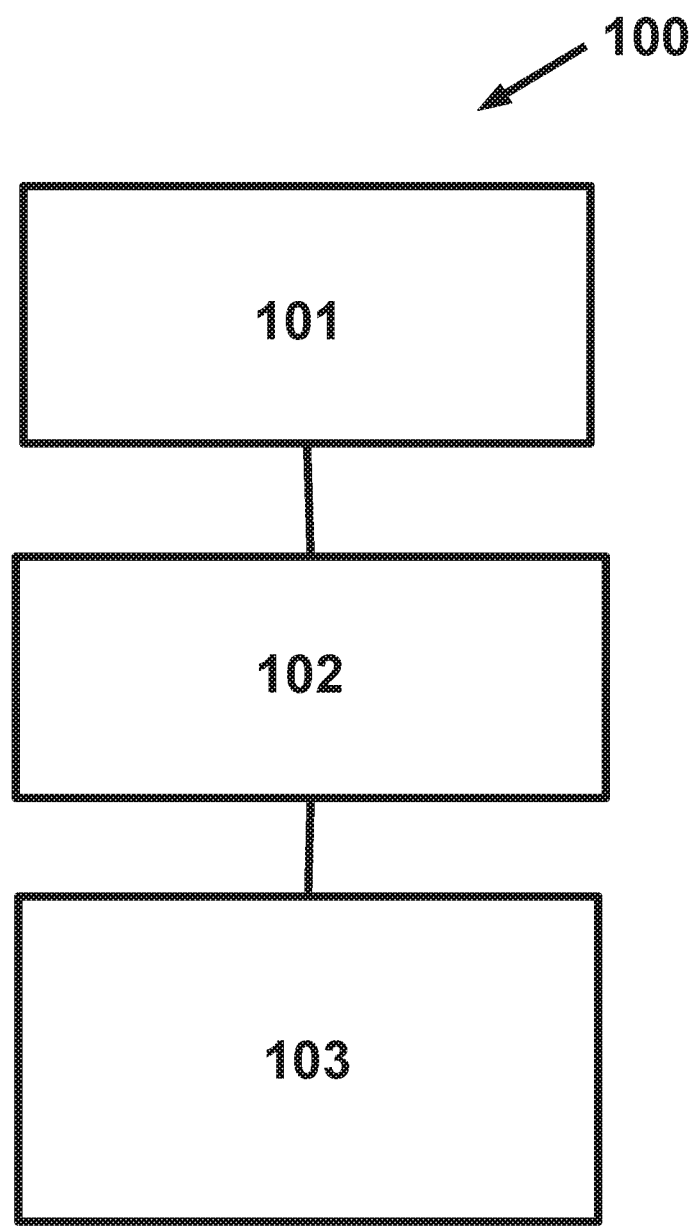
FIG. 1 is a representation of an example of a method according to the present disclosure.

FIG. 1 represents an example of a method 100 for packing a plurality of three-dimensional (3D) models.

Packing may be understood as placing a set of given objects into a given container. In the present disclosure packing may comprise combining a plurality of 3D models in a manner seeking to reduce a volume occupied by the plurality of the 3D models in relation to a volume of a 3D virtual build volume, or in other words, to increase the built density of a plurality of 3D models, while maintaining potential constraints such as constraints on an inter model distance for example. Packing may also comprise rotating such 3D models such that a volume is occupied by 3D models to increase the built density of a plurality of 3D models. In some examples, packing may comprise arranging 3D models linearly in a 3D virtual build volume. In some examples, packing may comprise arranging 3D models in a staggered manner in a 3D virtual build volume. In some examples, packing may comprise arranging 3D models in piles in a 3D virtual build volume. In examples of the present disclosure, the method for packing 3D models allows generating digital information or data which may be transmitted and read by a 3D printing system in order to reproduce an arrangement of 3D models specified in such packing so that 3D objects are printed following such arrangement in a build volume.

The example method of FIG. 1 comprises packing a plurality of 3D models, wherein a plurality of 3D models may mean packing two or more 3D models or packing more than 50, or more than 500 3D models in the 3D virtual build volume. Packing a plurality of 3D models may comprise translating or rotating the more then 50 or more than 500 3D models. In some examples, packed 3D models do not overlap.

The example method of FIG. 1 comprises packing plurality 3D models in a 3D virtual build volume. A 3D virtual build volume may be understood as a digital representation of a build volume or printable box in a printing system or a 3D printer which may be used for printing 3D objects corresponding to the 3D models packed according to example methods of the present disclosure. For instance, a 3D printer may employ any of fusing agent, high-speed sintering, selective laser sintering, selective laser melting, stereolithography, etc. techniques. Thus, for instance, various types of materials, e.g., power-based materials, liquid-based materials, etc., may be used in a 3D printer. It should be understood that 3D printers having different configurations may implement the determined arrangements, or packing, of the objects, or 3D models, to be printed. Other types of additive manufacturing systems on which features disclosed herein may be employed include systems that employ selective laser sintering, selective laser melting, stereolithography, etc. A build bed or build volume may also be understood as a space above a xy-plane, or base, in a 3D printing system including a print engine which may be used to build 3D objects. A build volume may comprise a build platform, where, for example, a fusing process occurs, the platform adapted to lower layer by layer as a 3D product is produced layer by layer. The first layer may be applied on the platform, the second layer on top of the first, and so on.

The platform, which is a tangible object, may correspond to a base of a corresponding virtual build volume. In order to build 3D objects, layers of a specific build material and a specific thickness may be formed or built joining a first layer to a second layer in a build volume of a printing system. Layers may be built one on top of the other starting from a base of a build volume. The layers may be built parallel to the xy-plane which is parallel to a base of the build volume and may be stacked in a z-direction or thickness direction, which is perpendicular or normal to the xy-plane. Objects to be printed may be placed anywhere in the build volume. The layers of build material may have a unique height or layer thickness for a whole printing process. The layers of build material may have different heights or layer thicknesses for a whole printing process. A printing process may be understood as the process of printing all the objects belonging to a print job. In a same printing process, some sections of some objects may be printed with a layer thickness and some others with a different layer thickness. A 3D virtual build volume may present three dimensions: width, depth and height. Some of the dimensions, for example width and depth, may be fixed and may range from some tens of centimetres, for example 50 cm, to some metres, for example 2 or 10 m. The height may be fixed or may vary depending on the number of 3D models to be packed. For example, the height may be fixed from some tens of centimetres, for example 50 cm, to some metres, for example 2 or 10 m. For example, the height may vary depending a number or size of 3D models, for example on packing ten 3D models or packing 500 3D models. The 3D virtual build volume may present a base, on which the plurality of 3D models may be arranged. A base of a 3D virtual build volume is a digital representation of a base of a build volume or printable box. A base may coincide with a wall, or platform, on which 3D objects may be deposited following a layer-by-layer technique.

The example method of FIG. 1 comprises at block 101 identifying a plurality of sections. Identifying may be understood as specifying portions or sections of the plurality of 3D models which may respect specific characteristics. In an example, sections presenting a particular geometry may represent one section, or sections presenting a specific colour in a 3D model may represent one section. A section may be identified by curvature profiles as will be explained in more detail below.

A plurality of sections may be identified for a 3D model, for example 3 sections or 10 sections per 3D model. Different sections may present different thicknesses, for example, for a 10 cm-height 3D object, two 4 cm-sections and one 2 cm-section may be identified. The sections may have a thickness along a printing axis. In some examples the different thicknesses may be measured from a base of the 3D virtual build volume. In some examples, a section may be identified for one of the layers for building a plurality of objects corresponding to the plurality of 3D models. In some examples, for two or more of the layers for building a plurality of objects corresponding to the plurality of 3D models, one section may be identified. In examples where two or more layers of build material represent one section, efficiency may be improved in a printing process since a printing system may print using a same layer thickness for longer time compared with the case where one section represents one layer and the printing system changes the layer thickness layer after layer. For example, one section may correspond to 5 layers associated to a build material layer thickness. This may allow a printing system to maintain the layer thickness during the time to print the 5 layers.

A layer thickness may depend on a material for building a plurality of objects corresponding to the plurality of 3D models. In examples, a material for building a plurality of objects corresponding to the plurality of 3D models may comprise plastic or thermoplastic, or may contain a base of elastomers based on polybutadiene that makes the objects more flexible, and resistant to shocks. Layers for building such plastic objects may present a thickness from 70 µm to 120 µm for example. In examples where a section represents a layer, the section may present a thickness from 70 µm to 120 µm. In some examples, a material for building a plurality of objects corresponding to the plurality of 3D models may comprise metal, such as copper, bronze or silver for example. The layers for building the plurality of objects comprising metal may present a thickness from 10 µm to 20 µm for example. In examples where a section represents a layer comprising metal, the section may present a thickness from 10 µm to 20 µm. In some examples, a material for building a plurality of objects corresponding to the plurality of 3D models may comprise ceramics or ceramic powders. The layers for building the plurality of objects comprising ceramics or ceramic powders may present a thickness from 70 µm to 400 µm for example. In some examples, the sections are parallel to the base of the 3D virtual build volume.

The example method of FIG. 1 comprises, at block 101, identifying a plurality of sections of each 3D model according to curvature profiles of the sections.

A curvature profile may be a representation of geometrical features of a 3D model or features of a surface of the 3D model. A curvature profile may categorize the 3D models into geometrical feature categories. Categories may be defined in function of geometrical features of a 3D model or of a corresponding 3D object of a 3D model. For example, a curvature profile may identify sections presenting for example a substantially oval shape, a flat shape, a stepped shape, a convex shape, a concave shape, a discontinuous shape or a continuous shape. In an example, a section may be identified as a section presenting a pre-determined volume.

In some examples, a curvature profile of a 3D model may comprise a radius of curvature representing a distance from a set of equidistant points on a surface of the 3D model to a center point. In some examples, a curvature profile of a 3D model may comprise a radius of curvature representing a profile distance of a set of points on a surface of the 3D model from a point, whereby the profile distance represents distances in a tolerance range. In an example a curvature profile of a curved 3D model may be 2 cm, this curvature profile representing curved surfaces which radius may vary from 1.7 cm to 2.1 cm, whereby the variation around 2 cm is a tolerance range. A tolerance range may be some millimeters, for example 5 mm, or some centimeters, for example 5 cm. In some examples, a curvature profile of a 3D model on a surface point may be an angle between a vector normal to a plane tangent to a surface and containing such surface point, and an axis. In some examples, such axis may be parallel to a base of the 3D virtual build volume. In some examples, such axis may be normal to a base of the 3D virtual build volume. In some examples, a curvature profile of a 3D model may be a profile angle between a vector normal to a plane tangent to a surface and containing such surface point, and an axis. In some examples, the profile angle may represent angles in a tolerance range, for example a curvature profile of a curved 3D model may be 15°, whereby this curvature profile represents curved surfaces which angle may vary from 14° to 20° for example, whereby the variation of about 6° may be a tolerance range. In other examples, the curvature profile represents curved surfaces which angle may vary from 10° to 20°, whereby the variation of about 10° may be a tolerance range.

Different sections may present different curvature profiles or may present a same curvature profile. In some examples a same section may be identified corresponding to a number of points comprised within a curvature profile. In some examples, a specific section may be identified corresponding to a number of points comprised within a bundle of consecutive curvature profiles, whereby consecutive curvature profiles may follow each other along a printing axis. In some examples a section may be a group of points, the group being parallel to a base of the build volume.

The example method of FIG. 1 comprises in block 102 associating a build material layer thickness to each section of the plurality of sections. Associating may be understood for example as mapping specific build material layer thicknesses to different identified sections. Object portions corresponding to portions of the 3D models with different layer thicknesses may be printed in a printing process. On the one hand, using layers with a thickness of 120 μm instead of a thickness of 80 μm may permit reducing the time to print an object. On the other hand, using a lower layer thickness, such as a thickness of 70 μm, permits increasing the definition of the object. A 3D object built with layers presenting a thickness of 70 μm may however take longer to generate than a same 3D objects built with layers presenting a thickness of 120 μm. Examples of the present disclosure permit combining such effects by specifying or associating a build material layer thicknesses to different sections dynamically. During a printing process, complete or whole layers of a single thickness may be formed, so object sections which are associated to a different layer height are arranged in the build volume accordingly. In some examples associating comprises associating a thicker build material layer thickness from a set of pre-established build material layer thickness to sections of a 3D model arranged at or towards a base of a build volume. For example, given a set of pre-established build material layer thickness such as {10 μm, 20 μm, 40 μm, 120 μm} a 3D model comprising two sections in a printing direction presenting associated thicknesses of 40 μm and 120 μm per layer at each corresponding section, the 3D model is rotated so that the section presenting an associated thickness of 120 μm is set on, close to or towards the base of the virtual build volume. In some examples associating comprises associating consecutive build material layer thicknesses from a set of pre-established build material layer thickness to consecutive sections of a 3D model. For example, given a set of pre-established build material layer thickness such as {10 μm, 20 μm, 40 μm, 120 μm} three consecutive sections of a 3D model are associated to 10 μm, 20 μm and 40 μm respectively.

The example method of FIG. 1 comprises at block 102 associating a build material layer thickness to each section of the plurality of sections, whereby each associated build material layer thickness is one of a set of pre-established build material layer thicknesses. A set of pre-established build material layer thicknesses may be provided and the method of the present disclosure allows associating one or several build material layer thickness to the identified sections such that a printing system may be set to print according to the associated build material layer thickness of an example method according to the present disclosure. The build material layer thicknesses may be comprised in a range of values from 60 μm to 120 μm. In some examples the build material layer thicknesses may be 70 μm or 80 μm or 100 μm or 120 μm. For example, an example method of the present disclosure may allow creating a print job for a printing system to set the printing system to print layers of build material layer thicknesses according to the associated build material layer thicknesses of an example method of the present disclosure. A print job may be understood as a file received by a printing system, the print job including data and information permitting the printing system to print objects in a given spatial arrangement in a build volume comprised in the printing system. The set of pre-established build material thicknesses may be provided by the printing system or may be stored in a storage unit of a processor and may be provided by any means of communication such as WiFi, Ethernet communication, Bluetooth, or by readings from a storage medium. The set of pre-established build material layer thicknesses may comprise any number of pre-established build material layer thicknesses, for example, one or two or four or ten thicknesses, for example {10 μm, 20 μm, 40 μm, 120 μm}. Such pre-determined thicknesses may be pre-determined due to specific characteristics of a specific printer and may for example correspond to hardware requirement. The solutions proposed in the current disclosure permit adapting packing to specifics of a given 3D printer or 3D printer type, taking into account layer thicknesses dictated or pre-determined by such 3D printer or printer type.

The example method of FIG. 1 comprises in block 103 packing the plurality of 3D models according to each associated build material layer thickness. Once build material layer thicknesses are associated to the identified sections, the plurality of 3D models are packed or nested in the 3D virtual build volume. The packing allows spatially arranging at least some 3D models such that the built or spatial density of a plurality of 3D models in the virtual build volume may be increased. In some examples packing may comprise linearly arranging 3D models in a 3D virtual build volume. In some examples, packing may comprise arranging 3D models in a staggered manner or in piles in a 3D virtual build volume. In some examples packing or arranging may comprise rotating some of the 3D models such that the built density of a plurality of 3D models in the virtual build volume may be increased, for example by approximating the convex section of a first 3D model to a concave section of a second 3D model. A 3D model may accept in the preparation of the packing process a specific number of rotations, for example 10 rotations or 20 rotations per 3D model. The packing according to the present disclosure may define a layer thickness for objects corresponding to the plurality of 3D models at each of the regions of the virtual build volume in function of the identified sections and the associated build material layer thicknesses and also may reduce a layer thickness in function of the arrangement, the arrangement comprising positioning in a x, y, or z direction and also rotating the 3D model. The example method of FIG. 1 comprises at block 103 packing the plurality of 3D models according to each associated build material layer thickness, whereby packing comprises spatially arranging at least some 3D models in the 3D virtual build volume according to one or more criteria. A criterion is a norm or rule which may be followed by a method for packing 3D models in order to attain an objective. One or more criteria may comprise reducing the total number of layers for building a plurality of objects corresponding to the plurality of 3D models, or may comprise increasing a quality of an object corresponding to a 3D model, or may comprise reducing the height occupied by a plurality of 3D models in a 3D virtual build volume. In some examples, the one or more criteria comprise increasing the number of 3D models packed in the 3D virtual build volume. This increase of the number of 3D models packed in the 3D virtual build volume may take place while maintaining or even reducing dimensions of the 3D virtual build volume, for example by mixing 3D models in the 3D virtual build volume in function of their size, for example fitting smaller 3D models between spaces between larger 3D models. In some examples packing comprises placing the 3D models in the 3D virtual build volume in such a way that sections associated to a thicker build material layer thickness are placed at or towards a base of the 3D virtual build volume, for example to increase stability during the building process.

The example method of FIG. 1 comprises in block 103 packing the plurality of 3D models according to each associated build material layer thickness, whereby packing comprises spatially arranging at least some 3D models in the 3D virtual build volume according to one or more criteria, such that at least some of the sections of different 3D models associated to a same build material layer thickness are arranged in a same region of the 3D virtual build volume. The example method of FIG. 1 allows in some examples reducing the time to print since a group of 3D objects may be packed in a build volume of a printing system such that sections associated to a same build material thickness may be printed simultaneously or consecutively, in a same region of a build volume. Combining the identification of sections of the 3D models according to curvature profiles and the arrangement in a same region of the 3D virtual build volume by thicknesses allows reducing the printing time of a printing system, as a printing speed is increased in certain sections of the 3D model where the layer thickness is increased, while increasing the density of the 3D objects in the build volume. Higher object accuracy may be provided, providing thereby a higher surface smoothness of a printed 3D object, where the layer thickness is decreased. The example method 100 of FIG. 1 reduces the overall printing time by combining layer thicknesses of a plurality of objects in a printing execution while respecting the criteria specified by the packing such as maintaining or increasing quality for example. The method 100 of FIG. 1 allows combining different criteria such that printing time is reduced while, for example, maximizing quality or for example while increasing the number of 3D models packed in the 3D virtual build volume.

Figure 2:
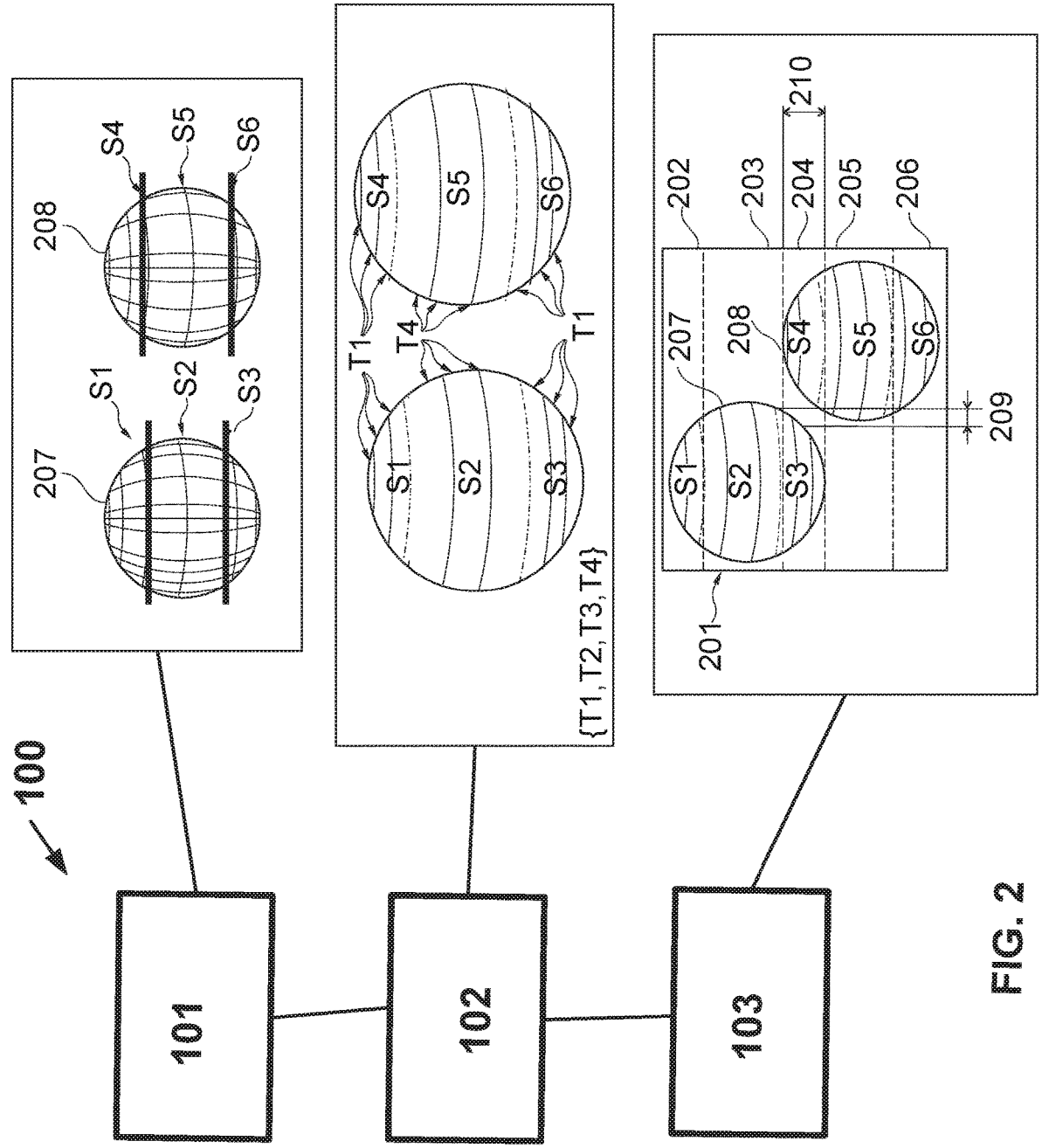
FIG. 2 is a representation of an example of a method according to the present disclosure.

The example method of FIG. 2 comprises, at block 101, identifying a plurality of sections S1, S2, S3, S4, S5 and S6 of each 3D model 207, 208 according to curvature profiles of the sections. The example of FIG. 2 comprises, at block 102, associating a build material layer thickness T1, T4 to each section S1 to S6 of the plurality of sections, whereby each associated build material layer thickness is one of a set of 4 pre-established build material layer thicknesses T1, T2, T3, T4. The example of FIG. 2 comprises, at block 103, packing the plurality of 3D models 207, 208 according to each associated build material layer thickness, whereby packing comprises spatially arranging at least some 3D models in the 3D virtual build volume 201 according to one or more criteria, such that at least some of the sections S1, S2, S3, S4, S5 and S6 of different 3D models 207, 208 associated to a same build material layer thickness are arranged in a same region 202, 203, 204, 205 or 206 of the 3D virtual build volume 201. For illustration purposes, FIG. 2 represents an example in which 4 pre-established build material layer thicknesses T1, T2, T3 and T4 are provided. In the example of FIG. 2, sections S1, S2, S3, S4, S5 and S6 may be identified. Each section may represent several layers of thickness T1, T2, T3 or T4 of corresponding 3D objects to be printed. Some of the sections such as S3 and S4 of the two illustrated spherical 3D models 207 and 208 are associated to the same build material layer thickness, for example, S3 in a first 3D model 207 and S4 in a second 3D model 208 are associated to a same build material layer thickness T1 as shown in FIG. 2. In other words, layers of corresponding 3D objects to be printed in such sections S3 and S4 would present a layer thickness T1, as indicated in FIG. 2. In FIG. 2 the spatial arrangement applies the criteria or norm that at least some of the sections S3, S4 of different 3D models 207, 208 associated to a same build material layer thickness T1 are arranged in a same region 204 of the 3D virtual build volume 201. A printing system may print two objects corresponding to 3D models 207 and 208 by a layer-by-layer technique. One should note in this example that the 3D models are spherical, and that the sections are identified considering, generally speaking, the angle formed between a plane tangential to a surface and the printing axis which, on the representation of FIG. 2, would be vertical. In particular, the sections S2 and S5 comprise a surface of 3D model which follows a relatively reduced angle to the printing axis, compared to the sections S1, S3, S4 and S6 which follow a relatively large angle to the printing axis. In order to avoid a stair stepping effect, sections S1, S3, S4 and S6 would use a build material layer thickness T1 more reduced than the build material layer thickness T4 used for S2 and S5 for each of the layers of the objects corresponding to 3D models 207 and 208. In the example method of FIG. 2, thickness T1 is associated also to sections S1 and S6, but these sections S1 and S6 are not arranged in a same region of the 3D virtual build volume since in this example the two 3D models 207, 208 do neither fit in line in an horizontal axis of the build volume nor in a vertical axis. Two portions of both 3D objects 209, 210 are overlapped, providing thereby the staggered arrangement shown in FIG. 2, at block 103. This distribution leads to arrange the 3D models 207 and 208 such that sections S1 and S6 are not arranged in a same region of the 3D virtual build volume 201. Note that sections S2 and S5 which would be less sensitive to stair-stepping may be associated to build material layer thickness T4 whereby T4 is larger than T1, thereby permitting gaining time when building such sections.

Figure 3:
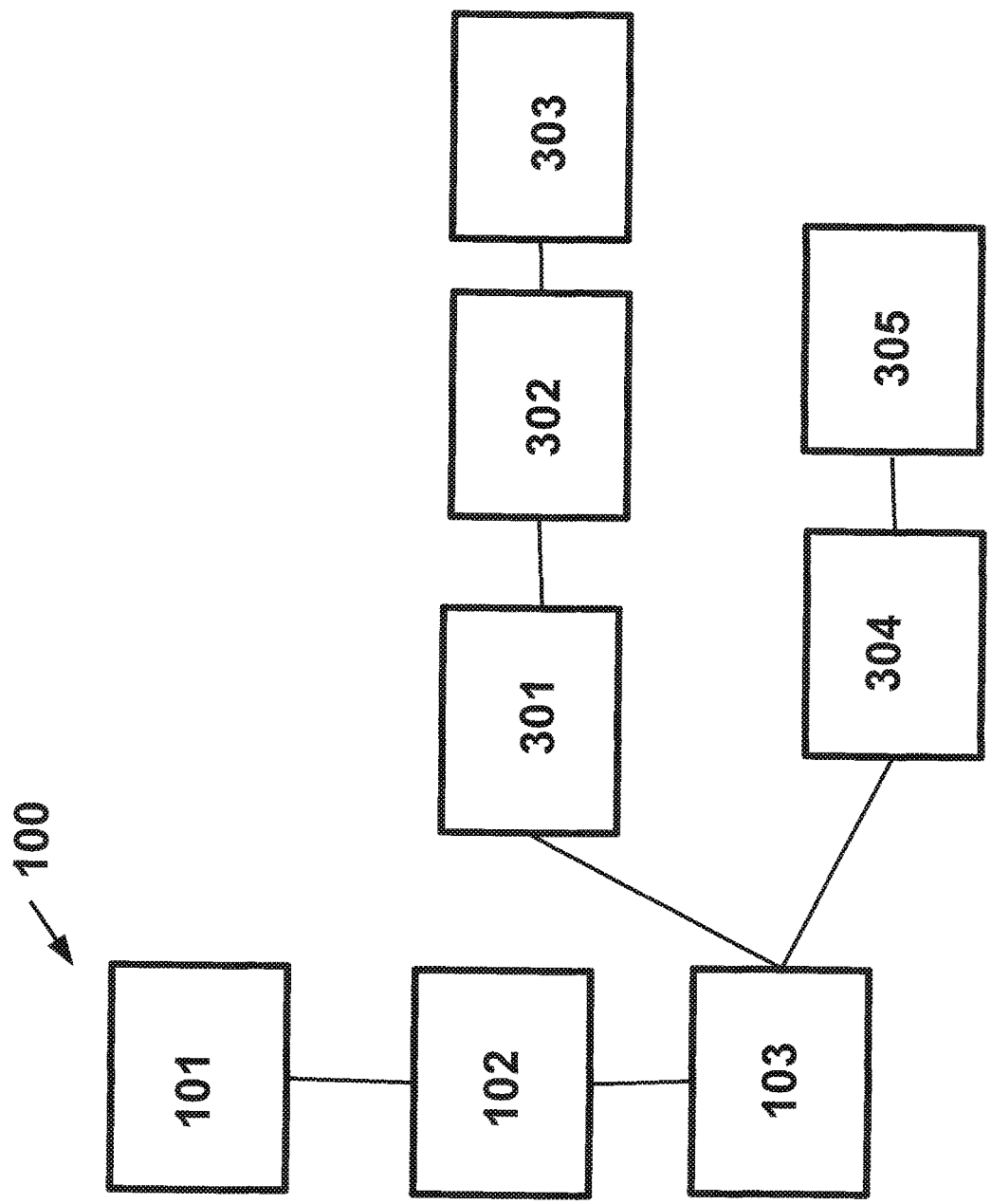
FIG. 3 is a representation of an example of a method according to the present disclosure.

In an example method 100 of FIG. 3 one or more criteria may comprise reducing 301 the number of layers for building a plurality of objects corresponding to the plurality of 3D models. This example method allows arranging the 3D models such that a printing system may be set to print according to the packing and may allow reducing the time to print of such printing system. Reducing the total number of layers, for example to a minimum to print a 3D object, results in employing less time to print and increasing thereby the efficiency of a printing system.

In an example method 100 of FIG. 3, packing a plurality of 3D models may comprise, at block 302, determining, for each 3D model of the plurality, a resulting build material layer thickness by iteratively associating intermediate build material layer thicknesses; wherein packing comprises applying constraints on dimensions of the 3d virtual build volume. A resulting build material layer thickness should be understood as a build material layer thickness associated with a section which is obtained by iteration of a method according to this disclosure, iteration which progressively permits to comply with increasing constraints. Such a resulting build material layer thickness may for example be obtained after 3 iterations, whereby the last iteration leads to determining the resulting build material layer thickness while the earlier iterations lead to determining intermediate build material layer thicknesses as associated to a section. By iteratively associating intermediate build material layer thicknesses, packing comprises applying constraints on dimensions of the 3D virtual build volume 201. Applying constraints on dimensions of the 3D virtual build volume may be understood as arranging the 3D models such that the available volume of the 3D virtual build volume 201 is used to print a number of 3D objects for a given 3D virtual build volume. Combining reducing the total number of layers and iteratively associating intermediate build material layer thicknesses such that, for example, a 1m3-3D virtual build volume 201 is used, allows obtaining an optimum or improved solution for printing an increased number of 3D objects in a printing process for such a 1m3-3D virtual build volume 201. The number of iterations may vary depending on the number of 3D models to be packed, or on the number of rotations per 3D model. In some examples, a number of iterations may comprise 300 iterations. In some examples iteratively associating intermediate build material layer thicknesses comprises performing a method according to the present disclosure 200 times or 300 times or 5000 times, until a resulting build material layer thickness is obtained for each section of all or some of the plurality of 3D models of the present disclosure.

An example method of the present disclosure allows operating a first iteration comprising associating a first build material layer thickness of 70 μm per layer to a one identified section such that 9 layers are printed for building a 3D object. If a printing system is used which takes 2 seconds to build a layer, the first intermediate build material layer thickness of 70 μm allows printing the 9 layers in 18 seconds. The example method allows operating a second iteration comprising associating a second intermediate build material layer thickness to one identified section comprising layers of 120 μm such that 6 layers are built for building a 3D object. If a printing system which takes 2 seconds to build a layer is used, the second intermediate build material layer thickness of 120 μm allows printing the 6 layers in 12 seconds. This example method allows thereby determining for example a 120 μm build material layer thickness thereby increasing by about 70% the build material layer thickness and correspondingly reducing the time to print a 3D object by about 30% for printing a number of 3D models. Associating 120 μm build material layer thickness to the sections may however lead to reducing quality of the corresponding 3D objects through an increased stair-stepping effect. The same example method allows operating a third iteration comprising associating a third intermediate build material layer thickness of 70 μm to a first section and to a second section of a 3D model and a fourth intermediate build material layer thickness of 120 μm to a third section of the 3D model. If in such a case the 3D model would be spherical such as one of 3D models 207 or 208 of FIG. 2, T1 may correspond to 70 μm and T4 to 120 μm. Such third iteration may lead to a compromise between time to print and quality of the first, second and third sections of a 3D object. Combining different thicknesses for the first, second and third sections results in an employed time to print a 3D model of 14 seconds for 7 layers per 3D model. The third iteration may be chosen as a resulting solution comprising a resulting build material layer thickness for each of the first, second and third sections, since it is an improved iteration compared with the first iteration in terms of time to print, and it is an improved iteration compared to the second iteration in terms of quality. The described example allows dynamically changing the layer thickness during a printing process, when the third iteration is chosen as the resulting solution. The number of iterations may vary depending on the number of 3D models to be packed, or on the number of rotations per 3D model. In some examples, a number of iterations may comprise 500 iterations. In some examples iteratively associating intermediate build material layer thicknesses comprises performing a method according to the present disclosure 100 times or 500 times or 1000 times, until a resulting build material layer thickness is obtained for each section of all or some of the plurality of 3D models of the present disclosure.

In some examples the intermediate build material layer thicknesses may be associated to sections given an intermediate rotation. In other words, intermediate build material layers thickness may be associated not only to 3D models positioned in a plurality of positions in the x, y, z axis but also to a plurality of rotations per 3D model. A 3D model may accept a specific number of rotations, for example 10 rotations or 20 rotations per 3D model. The packing according to the present disclosure associates a layer thickness for objects corresponding to the plurality of 3D models at each of the regions of the virtual build volume in function of the identified sections and the associated build material layer thicknesses and also optimizes a layer thickness in function of the arrangement, the arrangement comprising positioning 3D models in a x, y, or z direction and also rotating the 3D models.

In an example method 100 of FIG. 3 packing comprises, at block 303, reducing a quality of specific 3D models while reducing the total number of layers for building a plurality of objects corresponding to the plurality of 3D models. Quality may be understood as how closely a tangible object printed out in layers through 3D printing corresponds to its related 3D model, or for example as an alignment between an object's printed layers with the corresponding 3D model curvature profile. An increase in quality of a 3D model may represent a decrease of a stair stepping effect or offset between layers of a printed 3D object. In other words, more quality may mean less offset between layers of a printed 3D object. In these examples, whereas both quality and number of layers are iteratively determined in order to associate a resulting build material layer thickness which satisfies a compromise between resolution or quality and time to print, the reduction of the number of layers is prioritized in case of conflict. In other words, if quality is determined per iteration, whereby a first iteration comprises associating a build material layer thickness which may increase a quality and may increase the number of layers and whereby a second solution may reduce the number of layers to the detriment of quality, then the second iteration would be retained as resulting iteration, determining thereby the resulting associated build material layer thickness and giving priority to timeliness over quality.

In an example method 100 of FIG. 3 the one or more criteria comprises, at block 304, increasing a quality of specific 3D models, whereby the quality of a 3D model depends on the spatial arrangement of the 3D model. Quality may be understood as explained above. The quality of an object may be increased by associating a build material layer thickness to each layer in such a way that stair stepping is minimized or reduced. Packing a plurality of 3D models in a 3D virtual build volume comprises that different 3D models are fitted into the 3D virtual build volume, wherein the 3D virtual build volume presents pre-defined dimensions, for example, a pre-defined width, a pre-defined depth, or a pre-defined height. Such pre-defined dimensions may coincide with dimensions of a build volume comprised in a printing system configured to receive instructions for printing according to an example method of the present disclosure. The quality of a 3D model may be increased if, instead of fitting all of the plurality of 3D models into the 3D virtual build volume, some of the 3D models are fitted so that a section of the 3D model is associated to a build material layer thickness which maximizes or improves the quality of the 3D model. Such arrangement may, for example, increase the space between models thereby reducing the number of 3D models which may fit into the 3D virtual build volume. The quality of a 3D model depends on the spatial arrangement of the 3D model, since different regions of the 3D virtual build volume in which the 3D models are arranged may be associated to the associated build material layer thickness of the sections.

In an example method (not represented in the figures) the one or more criteria comprises increasing a number of layers and increasing a quality of specific 3D models, whereby the quality of a 3D model depends on the spatial arrangement of the 3D model. This example method allows associating a build material layer thickness for a plurality of sections such that quality is prioritized in case of conflict between quality and reduction of number of layers. In other words, if quality is determined, a build material layer thickness improving quality would be associated even if such build material layer thickness may increase the number of layers for building a corresponding object. The quality of a 3D model also depends on the spatial arrangement of the 3D model, since different regions of the 3D virtual build volume in which the 3D models are arranged may be associated to the associated build material layer thickness of the sections. Increasing quality of a 3D object may imply associating a build material layer thickness to a section, and thereby a region of the 3D virtual build volume, even if some sections may be arranged in regions where the number of layers to print such 3D model is increased.

In the example method of FIG. 3 the one or more criteria comprises, at block 305, increasing a number of layers and increasing a quality of specific 3D models, whereby the quality of a 3D model depends on the spatial arrangement of the 3D model, wherein packing comprises determining a resulting build material layer thickness by iteratively associating intermediate build material layer thicknesses; and wherein packing comprises applying constraints on dimensions of the 3D virtual build volume. In these examples both quality and number of layers are iteratively determined such that an increase of quality is prioritized. In other words, if quality is determined per iteration, whereby a first iteration comprises associating a build material layer thickness which may increase a quality and may increase the number of layers and whereby a second solution may reduce the number of layers to the detriment of quality, then the first iteration would be retained as resulting iteration, determining thereby the resulting associated build material layer thickness. In some examples the intermediate build material layer thicknesses may be associated to sections given an intermediate rotation. In other words, intermediate build material layers thickness may be associated not only to 3D models positioned in a plurality of positions in the x, y, z axis but also to a plurality of rotations per 3D model. Applying constraints on dimensions of the 3D virtual build volume may be understood as arranging the 3D models such that the available volume of the 3D virtual build volume 201 is used to print a number of 3D objects for a given 3D virtual build volume. Combining reducing the total number of layers and iteratively associating intermediate build material layer thicknesses such that, for example, a 1m3-3D virtual build volume 201 is used, allows obtaining an optimum or improved solution for printing an increased number of 3D objects in a printing process for such a 1m3-3D virtual build volume 201.

Figure 4:
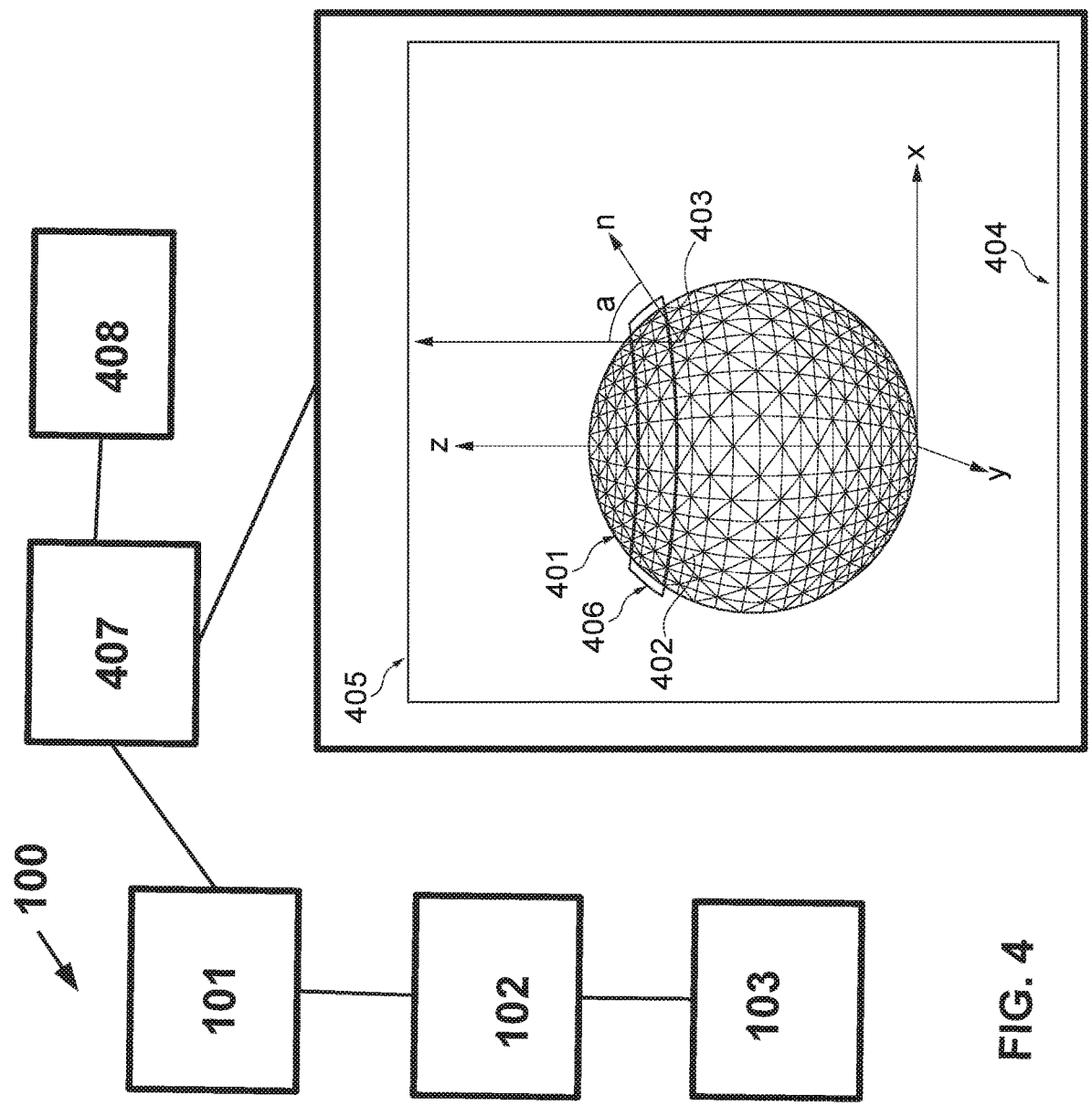
FIG. 4 is a representation of an example of a method according to the present disclosure.

In some examples the 3D models are meshed into finite elements. In an example method of FIG. 4 the 3D model 401 is meshed into finite elements 402, which in the example of FIG. 4 are triangles 402. The example method of FIG. 2 comprises, at block 408, meshing the 3D models into finite elements. The meshing may be achieved by a processor encoding the 3D models' geometry into so-called "tessellations". Tessellation is the process of tiling a surface with one or more geometric shapes such that there are no overlaps or gaps. Such geometric shapes may for example be hexagons, triangles, squares, or other polygons.

The example method of FIG. 4 comprises, at block 407, specifying the curvature profiles of the sections according to curvatures of the finite elements; wherein a curvature is an angle between a printing axis and a vector normal to a plane comprising a finite element; whereby the printing axis is an axis normal to a base of the 3d virtual build volume. The curvature profiles are specified according to curvatures of the finite elements 402; wherein a curvature is an angle between a printing axis "z" and a vector "n" normal to a plane comprising a finite element 403; whereby the printing axis "z" is an axis normal to a base 404 of the 3D virtual build volume 405. A processor may use triangular tiles 402 to cover the surface of the 3D model 401. The vertices and normal vectors of such triangles encode the geometry of the 3D model 401. The size of the triangles may approximate portions of curved regions and may vary depending on the geometry of the curved regions. For example, the size of the triangles may be comprised in a range of values varying from 0.0016 mm2 to 5000 mm2. A curvature may be determined at each of the triangles or tiles of the contours or surface of the 3D model relative to a printing axis "z" and a normal surface vector "n", as an angle "a". The angle "a" or curvature at each triangle may be comprised in a range from 1° to 180°. In the example of FIG. 4, a curvature profile of a section of the 3D model 401 on a triangle 403 may comprise the angle "a" between a vector "n" normal to a plane tangent to the surface of the triangle 403 and containing such triangle 403, and the "z" axis, for each triangle comprised in the section. In the example of FIG. 4, such "z" axis is normal to the base 404 of the 3D virtual build volume. In the example of FIG. 4, a curvature profile of a section of a 3D model may comprise profile angles 406 for a group of triangles forming the section, comprising angles comprised in a tolerance range, between a vector "n" normal to a plane tangent to the group of triangles and containing such triangles, and the "z" axis. For example a curvature profile may be represented as a spherical segment 406, whereby this curvature profile represents curved surfaces which angle may vary from 14° to 20° for example, whereby the variation of about 6° between 14 and 16 degrees may be a tolerance range. In the example of FIG. 4, a section may be identified whereby the section coincides with curvature profile 406. In another example, a section may be identified whereby a section comprises two or more curvature profiles.

In some example methods, specifying curvature profiles comprises identifying curvatures comprised in tolerance ranges and a number of finite elements presenting the identified curvatures. In the example of FIG. 4, a curvature profile 406 may be specified whereby the curvature profile may comprise profile angles which may vary from 14° to 20° for example, whereby the variation around 6° may be a tolerance range. In some example methods, identifying a number of sections of the 3D models comprises bundling some of the finite elements presenting the identified curvatures, whereby bundling some of the finite elements may be understood as building a group of finite elements, for example, triangles 403, for identifying a section. In the example method of FIG. 4, the spherical segment 406 may be a bundle of triangles 403 presenting a curvature profile comprising angles which may vary from 14° to 20°. Such bundle of triangles 403 may identify a section.

In some examples, a 3D model may be meshed into finite elements of different sizes. Meshing the 3D models into different sized finite elements, or triangles in the example of FIG. 4, may increase the accuracy when approximating a curved surface of the 3D model with a finite element. For example, the sphere 401 in FIG. 4 may be meshed into finite elements which may be relatively smaller on the poles of the sphere than finite elements on the equator of the sphere, the poles and equator being defined according to the printing axis which would correspond to the axis of rotation of the earth. This may allow representing the curved surface of the poles more accurately than if the poles where meshed into finite elements of the size of the triangles on the equator. In these examples, bundling may comprise weighing the finite elements of a first size and finite elements of a second size according to a resolution unit and bundling several sections of the 3D model according to a number of resolution units presenting the identified curvatures. The area of the finite elements may be weighed or normalized to a resolution unit, for example a voxel, or a pixel, or any other resolution unit. This may allow bundling a number of resolution units in order to identify sections of the 3D model independently form the size of triangles. This bundling of resolution units may independence the identification of sections from the size of the finite elements chosen by a processor when meshing the 3D models. Example methods of the present disclosure may be adapted to different 3D models which have been generated by different processors using, each processor, a type of meshing algorithm.

In some example methods, packing 3D models may be performed iteratively, whereby iterations may be performed using machine learning methods. In an example, a machine learning method includes a classification method. In an example, the classification method corresponds to one or more of support vector machines (SVM), random forest (RF) and artificial neural networks (ANN).

An SVM classification method may aim at defining an optimal hyperplane in an n-classification space, situating data points in different categories depending on which side of the hyperplane they fall. In an example, one or more hyperplanes are defined which correspond to determining an arrangement configuration comprising identifying sections of a 3D model and associating build material layer thicknesses. If a geometrical template would be associated to a specific section at a position X (X being for example a 3 dimensional vector comprising positions x, y and z) of the template, and if a hyperplane P corresponds to X=X1 (being a specific position defined by coordinates x1, y1 and z1), the specific geometrical template will be placed on one side of the plane if X>X1 and on the other side of the plane if X<X1. One should understand that such hyperplanes are virtual planes. The SVM classification method can be trained using recommendations of identification of sections and association of build material layers thicknesses to each section by a designer to locate the hyperplanes such that they follow gaps in the data. For example, if geometrical templates have an identification of a section X close to an X2 and other geometrical templates have an X value close to an X3 separated from X2 by a wide gap, a hyperplane can be placed between X2 and X3 separating the two groups of templates. Using an SVM will thereby allow classifying templates in various categories according to one or more hyperplanes, each category being associated to an identification of a section and association to corresponding build material layer thickness. A symbolic representation 501 limited to two dimensions in FIG. 5*a* includes a group of templates such as templates 502 or 503 located on a virtual map, for example in function of the volume of the geometrical template along a first axis 504 and in function of the distance between identified sections and a geometrical center of the corresponding geometrical template along a second axis 505. In the representation 501, template 503, having a volume higher than template 502, would be associated to a section identification further away from its geometrical center than template 502. Using SVM can in this example lead to defining hyperplane 506 leading to classifying the templates in two groups, whereby the group comprising 503 and located on one side of 506 is more likely to indicate the identification of a section closer to its geometrical center than the group comprising 502 and located on the other side of 506. In other examples, such modeling takes place along "n" dimensions and with high sample numbers which do not permit a schematic representation.

An RF classification method can be described as an assembly of decision trees where each tree includes branches which allow classifying geometrical templates according to their characteristics, for example in function of their volume. In an example, each template is related to a packing of 3D models comprising section identification and build material thickness association. In an example, numerous templates are processed by the decision tree, whereby each template data follows its specific path through the decision tree. Templates having the same or similar characteristics will follow the same path within the classification tree. Running such templates through the decision tree therefore leads in a learning phase to identifying the specific branches of the tree being linked to a specific section identification. Such learning phase may take place based on recommendation of section identification from a designer with a number of templates, leading for example to building numerous decision trees with many branches each, including paths that discriminate among different templates and section identification. A symbolic representation in FIG. 5*b* represents a decision tree 510, whereby path 511 was identified in a learning phase as corresponding to a specific section identification, and whereby path 512 was identified in a learning phase as corresponding to another section identification. At each intersection such as 513 a test such as for example "Is the section identified towards the center of the template" is made. This is of course a symbolic representation and RF processing of section identification can be significantly more complex. In an example, RF processing builds a tree, whereby each branch of the tree represents a template or group of similar templates, whereby each branch is associated to a section identification. Classification may increase in precision as additional templates are processed. This progressive process is referred to as the learning phase, whereby RF classification becomes increasingly trained.

The ANN method can be described as a number of artificial neurons or cells, each cell processing quantitative inputs and providing resulting outputs, the outputs being a mathematical function of the inputs, the mathematical function comprising parameters such as one or more weights, the weights being progressively adjusted as the network (i.e. the plurality of cells) is learning towards reflecting the logical structure of the data. In an example, the input can be the templates, the output being a related section identification. In a first phase, the various mathematical functions may return a first set of section identification which are not in line with appropriate section identification, such that such first set of identified sections would be modified by a designer. The ANN method will then adjust the weights of the mathematical functions to adjust section identification towards appropriate section identification. Progressively, the network will reflect a situation corresponding to real section identifications provided by the designer, such that section identification may be predicted when newly submitted templates are used as inputs. A symbolic representation in FIG. 5c illustrates ANN process 520, whereby various templates F are used as inputs 521 for cells or artificial neurons 522 including mathematical functions $f$, the neurons 522 having for example section identification P as outputs 523. Each mathematical function $f$ comprising weights which are adjusted until the artificial neural system reflects a relationship between templates and section identification close to what a designer would recommend.

Figure 6:
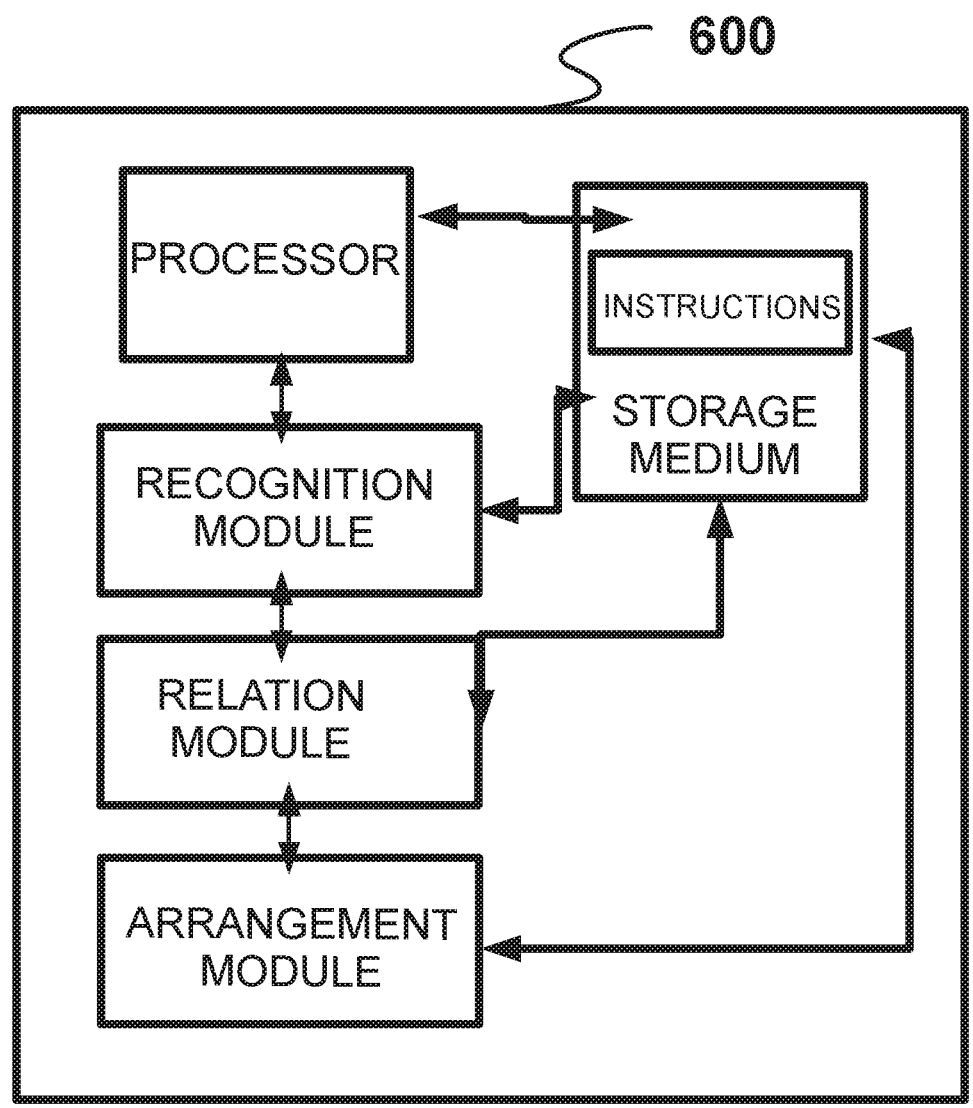
FIG. 6 is a representation of an example of an apparatus and of a storage medium according to the present disclosure.

FIG. 6 is a block diagram of an example apparatus 600 according to the present disclosure. Such an apparatus 600 may be comprised in a 3D printing system or may be external to a 3D printer. The apparatus 600 may comprise an interface to communicate with a 3D printing device. The apparatus may be a computing device or a controller, such as a personal computer, a server computer, a printer, a 3D printer, a smartphone, a tablet computer, etc. The apparatus 600 is depicted as including a processor and a machine-readable storage medium or data storage coupled to the processor. The processor may for example be any one of a central processing unit (CPU), a semiconductor-based microprocessor, an application specific integrated circuit (ASIC), and/or other hardware device suitable for retrieval and execution of instructions stored in the machine-readable storage medium or data storage. The apparatus 600 may comprise a recognition module to recognize sections of the 3D models according to curvatures of the sections of the 3D models. The apparatus 600 may comprise a relation module to relate a build material layer thickness to each of the curvatures, whereby each associated build material layer thickness is one of a set of pre-established layer thicknesses. The apparatus 600 may comprise an arrangement module to arrange the plurality of 3D models according to each associated build material layer thickness, whereby arranging comprises arranging the 3D models in the virtual build volume according to one or more criteria, such that at least some sections of different 3D models associated to a same build material layer thickness are arranged in a same region of the virtual build bed.

The processor may fetch, decode, and execute instructions of an instruction set stored on the machine-readable storage medium to cooperate with the processor and the data storage according to this disclosure for packing a plurality of three-dimensional (3D) models in a 3D virtual build volume, by: identifying a plurality of sections of each 3D model according to curvature profiles of the sections; associating a build material layer thickness to each section of the plurality of sections, whereby each associated build material layer thickness is one of a set of pre-established build material layer thicknesses; packing the plurality of 3D models according to each associated build material layer thickness, whereby packing comprises spatially arranging at least some 3D models in the 3D virtual build volume according to one or more criteria, such that at least some of the sections of different 3D models associated to a same build material layer thickness are arranged in a same region of the 3D virtual build volume.

The apparatus 600 may be such that the instruction set comprises instructions to list a plurality of sections of a plurality of 3D models according to curvatures of the sections of the 3D models, and to a set of pre-established layer thicknesses; instructions to link a build material layer thickness to each of the plurality of sections of each 3D model, whereby each associated build material layer thickness is one of the set and instructions to nest the plurality of 3D models according to each associated build material layer thickness, whereby nesting comprises spatially arranging at least some 3D models in a virtual build volume according to one or more criteria, such that at least some sections of different 3D models associated to a same build material layer thickness are arranged in a same region of the virtual build volume. The processor and modules may be configured to operate according to any of the methods described in this disclosure.

The machine-readable storage medium or data storage may be any electronic, magnetic, optical, or other physical storage device that contains or stores executable instructions. Thus, the machine-readable storage medium may be, for example, Random Access Memory (RAM), an Electrically Erasable Programmable Read-Only Memory (EEPROM), a storage device, an optical disc, and the like. In some implementations, the machine-readable storage medium may be a non-transitory machine-readable storage medium, where the term "non-transitory" does not encompass transitory propagating signals. Machine-readable storage medium may be encoded with a series of instructions executable by a processor to list a plurality of sections of a plurality of 3D models according to curvatures of the sections of the 3D models, and to a set of pre-established layer thicknesses; to link a build material layer thickness to each of the plurality of sections of each 3D model, whereby each associated build material layer thickness is one of the set; and to nest the plurality of 3D models according to each associated build material layer thickness, whereby nesting comprises spatially arranging at least some 3D models in a virtual build volume according to one or more criteria, such that at least some sections of different 3D models associated to a same build material layer thickness are arranged in a same region of the virtual build volume. The instructions may cause a processor to carry out any of the methods described in this disclosure.

The preceding description has been presented to illustrate and describe certain examples. Different sets of examples have been described; these may be applied individually or in combination, sometimes with a synergetic effect. This description is not intended to be exhaustive or to limit these principles to any precise form disclosed. Many modifications and variations are possible in light of the above teaching. It is to be understood that any feature described in relation to any one example may be used alone, or in combination with other features described, and may also be used in combination with any features of any other of the examples, or any combination of any other of the examples.

The invention claimed is:

1. A method for packing a plurality of three-dimensional (3D) models in a 3D virtual build volume, the method comprising:
   identifying a plurality of sections of each 3D model according to curvature profiles of the sections;
   associating a build material layer thickness to each section of the plurality of sections, whereby each associated build material layer thickness is one of a set of pre-established build material layer thicknesses;

packing the plurality of 3D models according to each associated build material layer thickness, whereby packing comprises spatially arranging at least some 3D models in the 3D virtual build volume according to one or more criteria, such that at least some of the sections of different 3D models associated to a same build material layer thickness are arranged in a same region of the 3D virtual build volume.

2. A method in accordance with the method of claim 1 wherein the one or more criteria comprises reducing a total number of layers for building a plurality of objects corresponding to the plurality of 3D models.

3. A method in accordance with the method of claim 2 wherein packing comprises determining a resulting build material layer thickness by iteratively associating intermediate build material layer thicknesses; and
wherein packing comprises applying constraints on dimensions of the 3D virtual build volume.

4. A method in accordance with the method of claim 3 wherein packing comprises reducing a quality of specific 3D models.

5. A method in accordance with the method of claim 1 wherein the one or more criteria comprises increasing a quality of specific 3D models, whereby the quality of a 3D model depends on the spatial arrangement of the 3D model.

6. A method in accordance with the method of claim 5 wherein the one or more criteria comprises increasing a number of layers;
wherein packing comprises determining a resulting build material layer thickness by iteratively associating intermediate build material layer thicknesses; and
wherein packing comprises applying constraints on dimensions of the 3D virtual build volume.

7. A method in accordance with the method of claim 1 comprising meshing the 3D models into finite elements.

8. A method in accordance with the method of claim 7 comprising specifying the curvature profiles of the sections according to curvatures of the finite elements;
wherein a curvature is an angle between a printing axis and a vector normal to a plane comprising a finite element;
whereby the printing axis is an axis normal to a base of the 3D virtual build volume.

9. A method in accordance with the method of claim 8 comprising:
identifying curvatures comprised in tolerance ranges and a number of finite elements presenting the identified curvatures;
identifying a number of sections of the 3D models by bundling some of the finite elements presenting the identified curvatures.

10. A method in accordance with the method of claim 9 comprising meshing a 3D model into finite elements of different sizes;
wherein bundling comprises:
weighing the finite elements of different sizes according to a resolution unit; and
bundling several sections of the 3D model according to a number of resolution units presenting the identified curvatures.

11. A method in accordance with the method of claim 1, wherein the one or more criteria comprises reducing a space occupied by the packed 3D models in the 3D virtual build volume.

12. A method in accordance with the method of claim 1, wherein the one or more criteria comprise increasing the number of 3D models packed in the 3D virtual build volume.

13. An apparatus for arranging three-dimensional (3D) models in a virtual build bed, the apparatus comprising
a processor;
a storage coupled to the processor;
a recognizing module to recognize sections of the 3D models according to curvatures of the sections of the 3D models;
a relating module to relate a build material layer thickness to each of the curvatures, whereby each associated build material layer thickness is one of a set of pre-established layer thicknesses;
an arrangement module to arrange the plurality of 3D models according to each associated build material layer thickness, whereby arranging comprises arranging the 3D models in the virtual build volume according to one or more criteria, such that at least some sections of different 3D models associated to a same build material layer thickness are arranged in a same region of the virtual build bed.

14. An apparatus in accordance with the apparatus of claim 13 comprising an interface to communicate with a 3D printing device.

15. A non-transitory machine readable storage medium encoded with instructions executable by a processor, the machine-readable storage medium comprising:
instructions to list a plurality of sections of a plurality of 3D models according to curvatures of the sections of the 3D models, and to a set of pre-established layer thicknesses;
instructions to link a build material layer thickness to each of the plurality of sections of each 3D model, whereby each associated build material layer thickness is one of the set; and
instructions to nest the plurality of 3D models according to each associated build material layer thickness, whereby nesting comprises spatially arranging at least some 3D models in a virtual build volume according to one or more criteria, such that at least some sections of different 3D models associated to a same build material layer thickness are arranged in a same region of the virtual build volume.

* * * * *